US010957667B2

(12) United States Patent
Lee et al.

(10) Patent No.: US 10,957,667 B2
(45) Date of Patent: Mar. 23, 2021

(54) INDIUM SOLDER METALLURGY TO CONTROL ELECTRO-MIGRATION

(71) Applicant: Intel Corporation, Santa Clara, CA (US)

(72) Inventors: Kyu Oh Lee, Chandler, AZ (US); Yi Li, Chandler, AZ (US); Yueli Liu, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/328,135

(22) PCT Filed: Oct. 1, 2016

(86) PCT No.: PCT/US2016/055082
§ 371 (c)(1),
(2) Date: Feb. 25, 2019

(87) PCT Pub. No.: WO2018/063415
PCT Pub. Date: Apr. 5, 2018

(65) Prior Publication Data
US 2019/0189582 A1 Jun. 20, 2019

(51) Int. Cl.
*H01L 23/498* (2006.01)
*H01L 23/00* (2006.01)
(Continued)

(52) U.S. Cl.
CPC .......... *H01L 24/16* (2013.01); *B23K 35/0238* (2013.01); *B23K 35/0244* (2013.01);
(Continued)

(58) Field of Classification Search
CPC ... H01L 2924/0105; H01L 2224/73265; H01L 2224/73204; H01L 2924/15311; H01L 2924/01049
(Continued)

(56) References Cited

U.S. PATENT DOCUMENTS 6,486,411 B2 * 11/2002 Miura ................. H05K 3/3463
174/256
8,507,376 B2   8/2013 Ewert et al.
(Continued)

FOREIGN PATENT DOCUMENTS

KR   10-2011-0070987   6/2011

OTHER PUBLICATIONS

International Search Report and Written Opinion for International Patent Application No. PCT/US2016/055082 dated Jun. 30, 2017, 11 pgs.
(Continued)

*Primary Examiner* — Jonathan Han
(74) *Attorney, Agent, or Firm* — Schwabe, Williamson & Wyatt, P.C.

(57) ABSTRACT

Embodiments are generally directed to indium solder metallurgy to control electro-migration. An embodiment of an electronic device includes a die; and a package substrate, wherein the die is bonded to the package substrate by an interconnection. The interconnection includes multiple interconnects, and wherein the interconnection includes a solder. The solder for the interconnection includes a combination of tin (Sn), copper (Cu), and indium (In).

23 Claims, 5 Drawing Sheets

(51) Int. Cl.
  *B23K 35/24* (2006.01)
  *C22C 13/00* (2006.01)
  *B23K 35/02* (2006.01)
  *B23K 35/26* (2006.01)

(52) U.S. Cl.
  CPC ............ *B23K 35/24* (2013.01); *B23K 35/262* (2013.01); *C22C 13/00* (2013.01); *H01L 23/00* (2013.01); *H01L 23/49816* (2013.01); *H01L 23/49866* (2013.01); *H01L 24/13* (2013.01); *H01L 24/81* (2013.01); *H01L 2224/13109* (2013.01); *H01L 2224/13111* (2013.01); *H01L 2224/13155* (2013.01); *H01L 2224/13247* (2013.01); *H01L 2224/16227* (2013.01); *H01L 2224/81203* (2013.01); *H01L 2224/81815* (2013.01)

(58) Field of Classification Search
  USPC ........ 438/125, 614, 106, 612; 257/737, 772, 257/E21.508, 778
  See application file for complete search history.

(56) References Cited

U.S. PATENT DOCUMENTS

| | | | |
|---|---|---|---|
| 2003/0186072 A1* | 10/2003 | Soga | H01L 24/32 428/620 |
| 2008/0000549 A1 | 1/2008 | Sheng et al. | |
| 2008/0095926 A1* | 4/2008 | Sekine | H05K 3/0094 427/96.1 |
| 2009/0170246 A1* | 7/2009 | Chatterjee | H01L 24/81 438/109 |
| 2011/0195543 A1 | 8/2011 | Jadhav et al. | |
| 2014/0291834 A1* | 10/2014 | Gandhi | H01L 25/18 257/737 |
| 2016/0204076 A1 | 7/2016 | Lin et al. | |

OTHER PUBLICATIONS

International Preliminary Report on Patentability for International Patent Application No. PCT/US2016/055082, dated Apr. 11, 2019, 8 pgs.

* cited by examiner

INDIUM SOLDER METALLURGY TO CONTROL ELECTRO-MIGRATION

CROSS-REFERENCE TO RELATED APPLICATION

This patent application is a U.S. National Phase Application under 35 U.S.C. § 371 of International Application No. PCT/US2016/055082, filed Oct. 1, 2016, entitled "INDIUM SOLDER METALLURGY TO CONTROL ELECTRO-MIGRATION," which designates the United States of America, the entire disclosure of which is hereby incorporated by reference in its entirety and for all purposes.

TECHNICAL FIELD

Embodiments described herein generally relate to the field of electronic devices and, more particularly, indium solder metallurgy to control electro-migration.

BACKGROUND

In the fabrication of electronic devices and systems, solder of various compositions continues to be utilized for many interconnections, including solder bump connections and other similar structures. However, the miniaturization of electronics, with extremely fine pitch interconnections, may cause increased difficulties related to the physical and chemical properties of the solder.

Electro-migration (EM) is the transport of material caused by the gradual movement of the ions in a conductor that results from momentum transfer between conducting electrons and diffusing metal atoms. In particular, electro-migration may result in the movement of nickel or other materials in interconnections.

Electro-migration caused by excessive current stress in an interconnect can result in premature failure of the interconnect and electronic device. Electro-migration is a critical reliability requirement for first level interconnect (FLI) architecture, such architecture being the interconnect between the die and the package. This has become an increasingly difficult challenge because of the demand for finer pitch interconnections and the resulting higher current densities.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Embodiments described herein are generally directed to indium solder metallurgy to control electro-migration.

For the purposes of this description:

"Solder" refers to a fusible metal alloy used to create a permanent or semi-permanent bond between metal elements including electronic elements, with lead-free solder commonly including certain combinations of tin, silver, and copper (Sn—Ag—Cu, and which may be referred to as "SAC solder").

In some embodiments, a solder includes indium in a composition with tin and copper (SnCuIn). In some embodiments, SnCuIn solder is applied in the fabrication of an electronic interconnection. In some embodiments, an electronic device or system includes one or more interconnections including SnCuIn solder.

Figure 1:
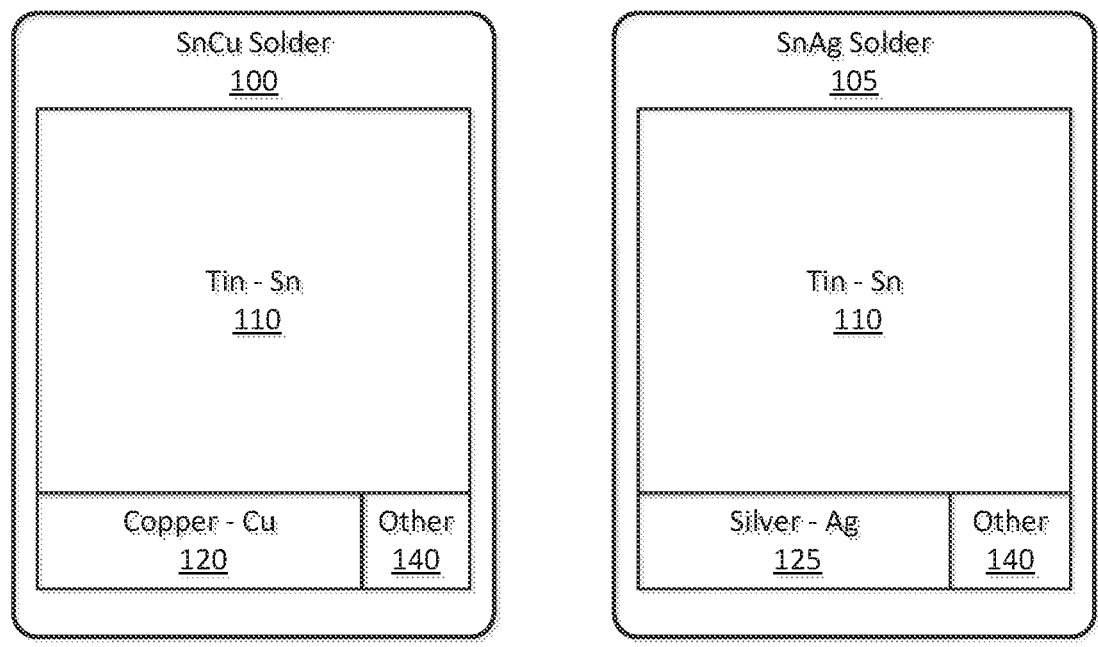
FIG. 1 illustrates solder composition according to an embodiment.
Figure 1:
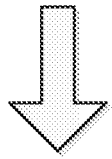
Figure 1:
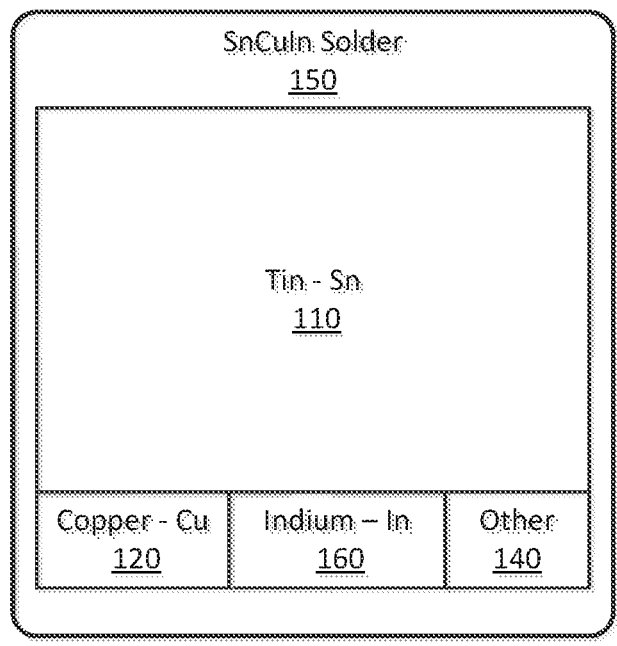

FIG. 1 illustrates solder composition according to an embodiment. In some embodiments, component elements of conventional lead-free solders utilized in electronic fabrication include SnCu solder 100, which includes certain percentages of tin (Sn) 110 and copper (Cu) 120, and potentially small amounts of other materials 140, and SnAg solder 105, which includes certain percentages of tin 110 and silver (Ag) 125, and potentially small amounts of other materials 140. However, the use and application of such conventional solder formulations may result in significant electro-migration issues as the pitch of interconnections become increasing fine.

In some embodiments, SnCuIn solder 150 includes certain percentages of tin 110 copper 120, with the addition of indium (In) 160. In some embodiments, the solder may potentially include small amounts of other materials 140. In some embodiments, the SnCuIn solder 150 is utilized in fabrication of electronic devices to provide control of electro-migration, as well as to improve strength of interconnections.

Electro-migration-induced damage in lead-free solder is strongly dependent on the tin (Sn) grain orientation in a solder joint. When the C-axis of Sn grain is orientated near to the current direction, very fast diffusion of copper and nickel through the Sn crystal along the C-axis will lead to rapid dissolution of IMC (Intermetallic Compounds) and under bump metallurgy, such as the nickel (Ni) layer in an existing first level interconnect architecture, and cavitation at the interface. (As used herein, the first level interconnect (FLI) refers to an interconnect between a die and a package, and second level interconnection refers to an interconnect between a package and a board.) This process results in an increased likelihood of an increased likelihood of early failure of the interconnection and device because of electro-migration effects.

However, when the C-axis of the Sn grain in an interconnection is not aligned with current direction, the cavitation and failure at solder-IMC interface may be reduced due to the relatively slow Sn self-diffusion in such interconnect.

In some embodiments, the addition of indium to tin and copper to form the SnCuIn solder results in a structure with reduced alignment with current flow, and thus reduced electro-migration. As the SnCuIn cools from a molten to intermediate phase, the indium affects the phase transformation to enhance polycrystallization, which acts to counter to the grain alignment of the material, and thus reduces electro-migration.

Further, indium can replace tin without changing the crystal structure, thus reducing the cavitation and failure of interconnects. With pure tin, there is material movement to create voids. However, the addition of indium, there is a flow against the electron flow, with indium filling the tine loss and flowing against failure conditions. In addition, the addition of indium to a solder compound may further be utilized to increase strength of an interconnection, thereby further protecting the interconnection from failure.

It is further noted that an embodiment of an apparatus, system, or process requires only a change in solder metallurgy, and does not create any impact on uball manufacturing, substrate process, or assembly material and process. The current SnCu material set may be utilized for SnCuIn without modification.

In some embodiments, the amount of indium in a solder compound is in the range of 0.1% to 2.0% by weight. In a particular implementation, the amount of indium in a solder compound is approximately 1.0%. In some embodiments, the amount of copper in the solder compound is 0.1% to 1.0% by weight For a present device, the bump Imax demand is within the device capability presuming one time reflow of the solder connection. However, for future devices having finer interconnections and increased capabilities, the Imax demand will increase, while the Imax capability will fall. The Imax capabilities may be measured for positive flow (+ve, electron flow from die to substrate) and negative flow (−ve, electron flow from substrate to die). Imax demand is projected to increase significantly with future devices, while the Imax capability with current solder metallurgy will be reduced, especially for negative (−ve, electron flow from substrate to die) Imax capability. When the die attachment process is moved from mass reflow to thermal compression bonding process, Imax capability (w/o reflow) is further degraded in comparison with mass reflow because the fast cool rate of thermal compression bonding (TCB) process creates an increased likelihood of resulting "bad" Sn grain orientation, which promotes the Ni diffusion inside Sn, and ultimately early device failure. Based on current solder metallurgy and first level interconnect (FLI) architecture, it is anticipated that there is significant gap between Imax demand and capability for the anticipated device.

A conventional solution to address electro-migration is to add an additional reflow after the TCB process to recover a portion of Imax performance by erasing or reducing the bad grain formed during the TCB process. There, may still be a gap between the Imax demand and the Imax capability with the additional reflow.

For this reason, an alternative material or architecture innovation is required to meet the demands of the new generation of products.

A common failure issue involves a negative polarity solder joint. There is some probability of early failure, with Ni consumption being the dominant cause of such early failure. Prevention of premature Ni consumption, particularly for negative polarity, and the retarding or elimination of Sn void accumulation for both positive and negative polarity will assist in improving Imax performance and prevention of premature device failure.

However, there is a symmetry-breaking transformation in low In Martensitic Transformations in Sn—In, wherein such transformation may be utilized to enhance polycrystallization in a solder material.

Figure 2A:
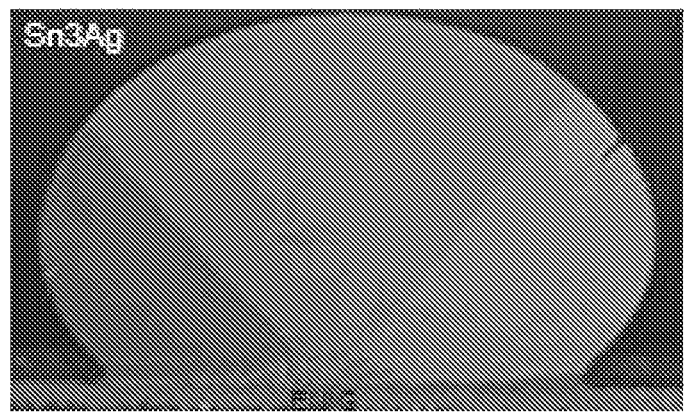
FIGS. 2A and 2B illustrate polycrystallization occurring in solder bumps according to an embodiment.
Figure 2B:
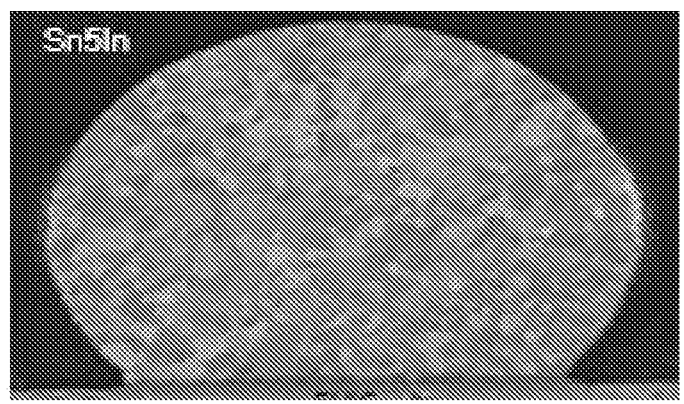

FIGS. 2A and 2B illustrate polycrystallization occurring in solder bumps according to an embodiment. As shown in FIG. 2A, the formation of a conventional Sn4Ag solder bump does not generate significant polycrystallization. SnAg or SnCu solders in general provide only minimal crystallization and thus are susceptible to electro-migration.

In contrast, as shown in FIG. 2B, an embodiment of a Sn4In solder bump results in significant polycrystallization. Such polycrystallization assists in improving Imax performance because the probability of "bad" Sn orientation in the solder joint will be significantly reduced due to polycrystallization structure.

Figure 3:
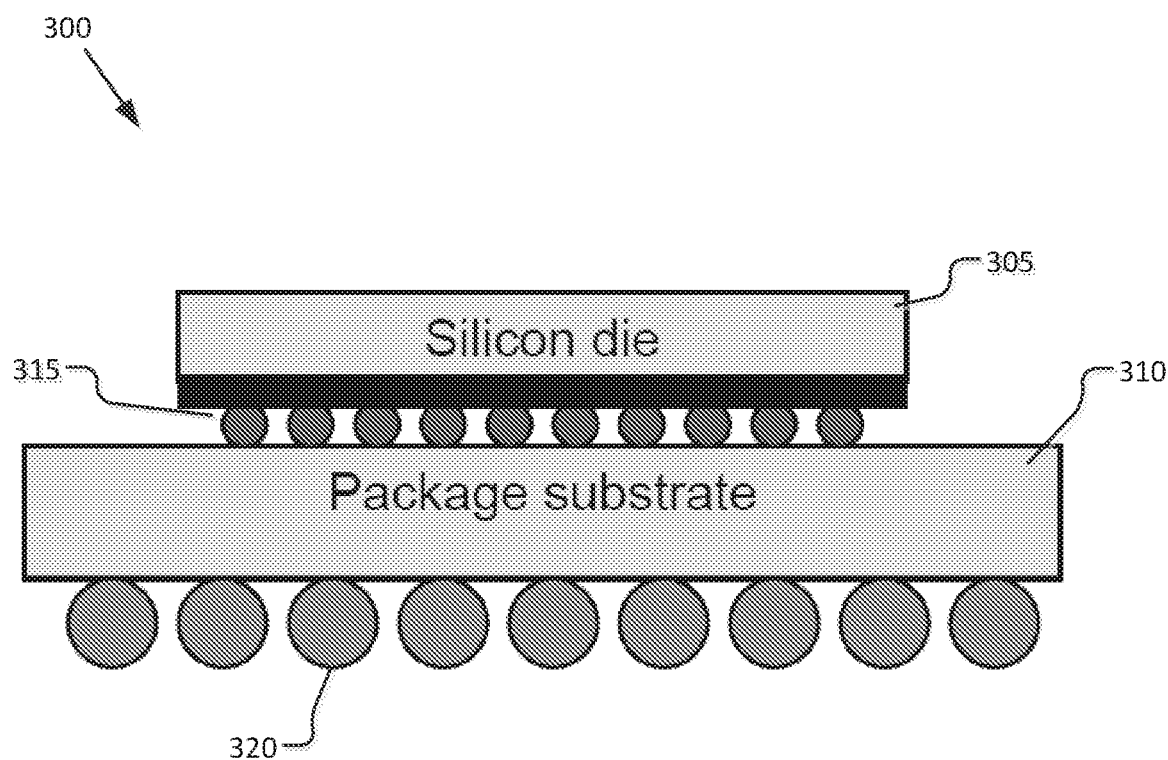
FIG. 3 is an illustration of an electronic device according to an embodiment.

FIG. 3 is an illustration of an electronic device according to an embodiment. In some embodiments, an electronic device 300 includes, but is not limited to, a first die, such as silicon die 305, connected to a package substrate 310 via a first level interconnect 315. In some embodiments, the device further includes a second level interconnect 320 for connection with a board.

In the illustrated implementation in FIG. 3, the second level interconnect 320 includes a ball grid array (BGA) having an array of solder balls for attachment of the package to pads on the board. However, embodiments are not limited to this structure, and may also include a pin grid array (PGA) including an array of metal pins for insertion into a socket or other similar connection, or a land grid array (LGA) including an array of pads on the package that are connection using spring contacts in a socket or similar connection on the board.

Figure 4:
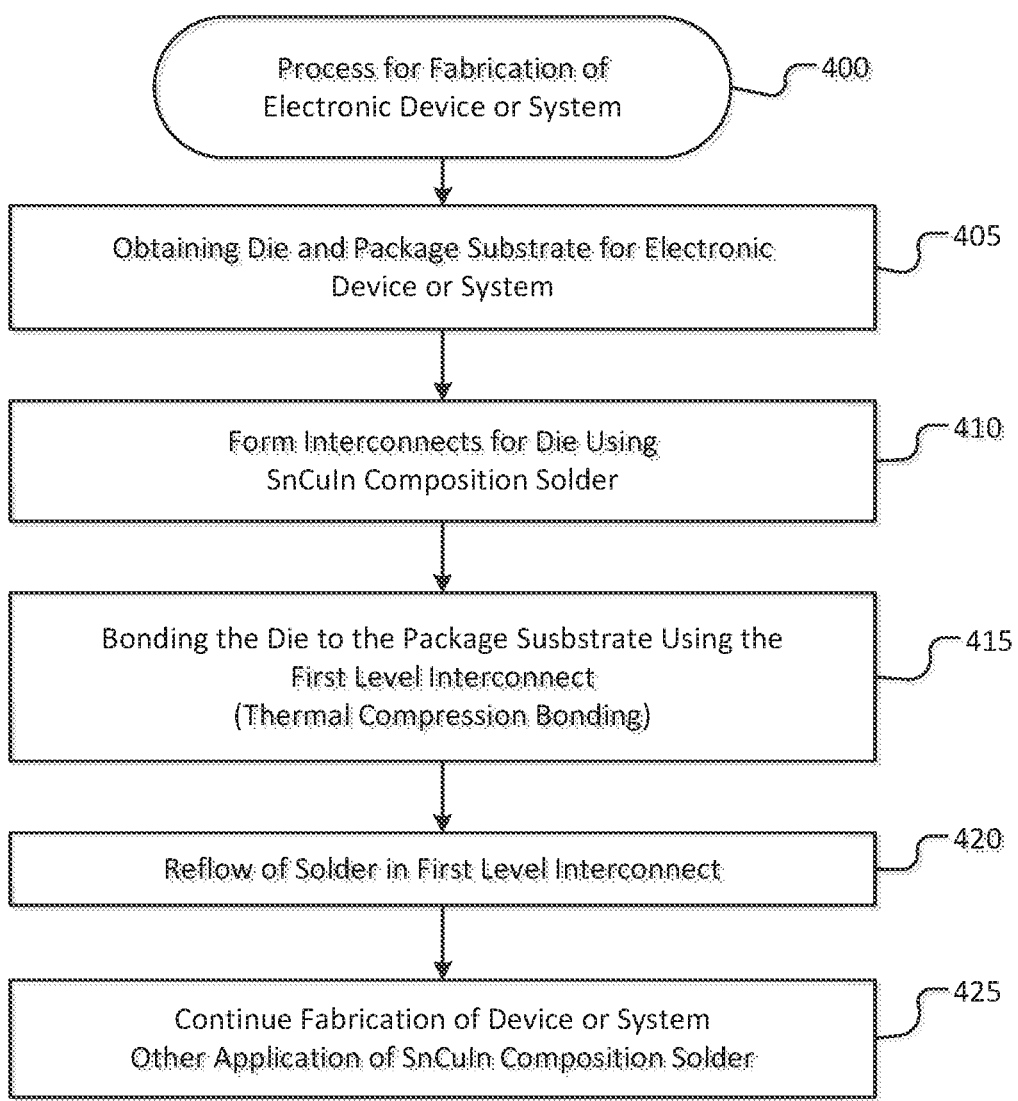
FIG. 4 is a flowchart to illustrate a process for fabrication of an electronic device according to an embodiment.

FIG. 4 is a flowchart to illustrate a process for fabrication of an electronic device according to an embodiment. In some embodiments, a process for fabrication of a device 400 includes the following:

405: Obtaining a die, for example a silicon die, and package substrate for electronic device or system.

410: Form interconnects for a first level interconnect between the die and the package substrate using an embodiment of alternative solder including a composition of tin, copper, and indium (SnCuIn solder). In some embodiments, the SnCuIn solder is utilized to control electro-migration in the first level interconnect.

415: Bonding the die to the package substrate using the first level interconnect, wherein the bonding may include a thermal compression bonding (TCB) process.

420: The process may further include reflow of the solder first level interconnect, wherein the reflow may further improve Imax flow in the interconnect.

425: Continue fabrication of the device or system, which may further include application of SnCuIn Composition Solder. In one implementation, a ball grid array of the package substrate, such as the ball grid array 320 illustrated in FIG. 3, is also composed of an indium solder composition.

Figure 5:
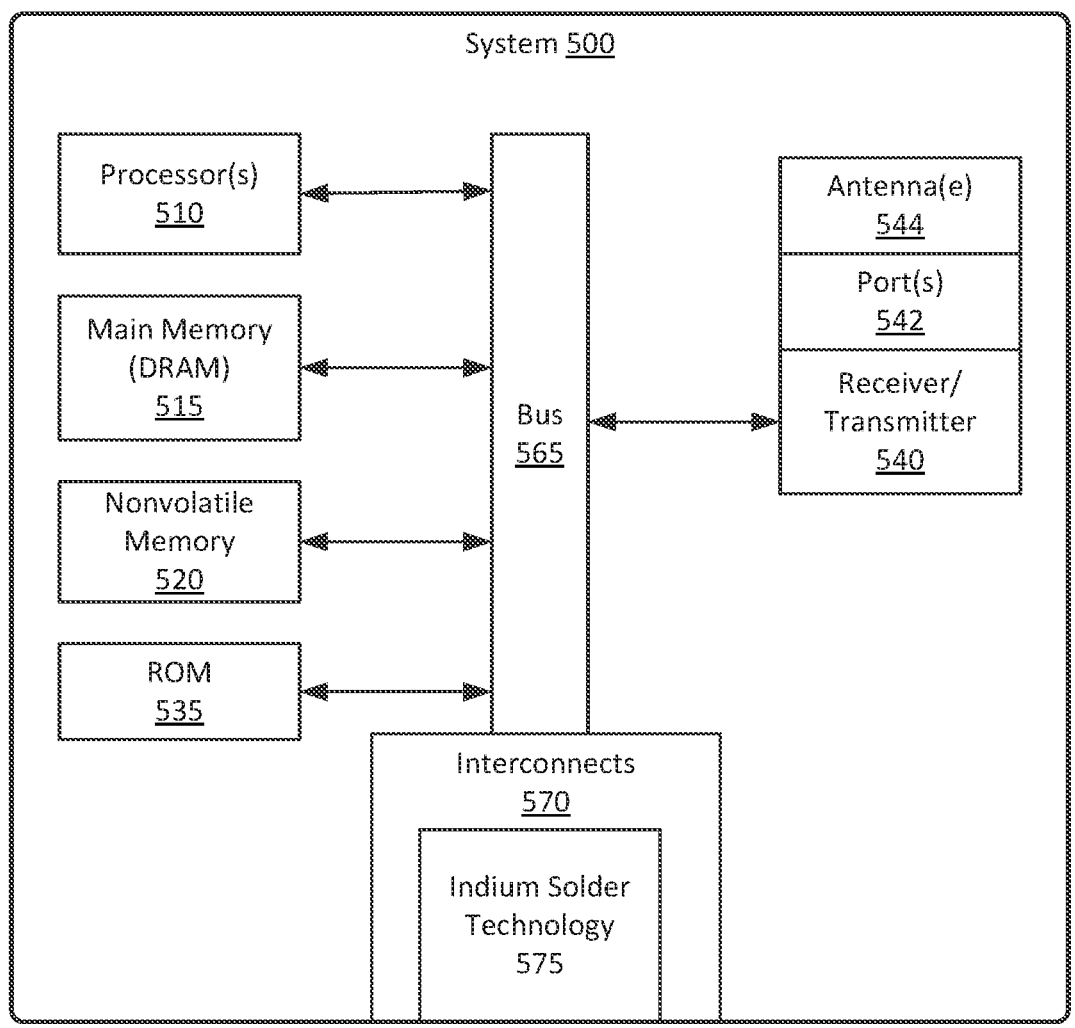
FIG. 5 is an illustration of system including indium solder metallurgy to control electro-migration according to an embodiment.

FIG. 5 is an illustration of an electronic device including indium solder metallurgy to control electro-migration according to an embodiment. In this illustration, certain standard and well-known components that are not germane to the present description are not shown. In some embodiments, a system 500 includes a bus 565, the bus being a communication means for transmission of data. The bus 565 is illustrated as a single bus for simplicity, but may represent multiple different interconnects or buses and the component connections to such interconnects or buses may vary. The bus 565 shown in FIG. 5 is an abstraction that represents any one or more separate physical buses, point-to-point connections, or both connected by appropriate bridges, adapters, or controllers.

In particular, the bus 565 includes interconnects 570, wherein the interconnects include indium solder technology 575 wherein indium in a composition with tin and copper (SnCuIn). In some embodiments, SnCuIn solder is applied in the fabrication of the interconnects 570, including first level interconnects between the die and the package. The application of the indium solder technology may be as illustrated in FIG. 4.

In some embodiments, the system 500 further includes a processing means such as one or more processors 510 coupled to the bus 565. The processors 510 may comprise one or more physical processors and one or more logical processors. In some embodiments, the processors may include one or more general-purpose processors or special-processor processors.

In some embodiments, the system 500 further comprises a random access memory (RAM) or other dynamic storage device or element as a main memory 515 for storing information and instructions to be executed by the processors 510. Main memory 515 may include, but is not limited to, dynamic random access memory (DRAM).

The system 500 also may comprise a non-volatile memory 520; and a read only memory (ROM) 535 or other static storage device for storing static information and instructions for the processors 510.

In some embodiments, the system 500 includes one or more transmitters or receivers 540 coupled to the bus 565. In some embodiments, the system 500 may include one or more antennae 544 (internally or externally), such as dipole or monopole antennae, for the transmission and reception of data via wireless communication using a wireless transmitter, receiver, or both, and one or more ports 542 for the transmission and reception of data via wired communications. Wireless communication includes, but is not limited to, Wi-Fi, Bluetooth™, near field communication, and other wireless communication standards.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, read-only memory (ROM), random access memory (RAM), erasable programmable read-only memory (EPROM), electrically-erasable programmable read-only memory (EEPROM), magnetic or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

In some embodiments, an electronic device includes a die; and a package substrate, the die being bonded to the package substrate by an interconnection including a plurality of interconnects, wherein the interconnects include a solder, the solder including tin (Sn), copper (Cu), and indium (In).

In some embodiments, the bonding of the interconnects includes a thermal compression bond (TCB).

In some embodiments, the bonding of the interconnects further includes reflow of the solder.

In some embodiments, the solder includes between 0.1% and 2.0% indium by weight. In some embodiments, includes between 0.5% and 1.0% indium by weight. In some embodiments, the solder includes between 0.1% and 1.0% copper by weight.

In some embodiments, wherein the interconnection further includes a nickel (Ni) layer.

In some embodiments, the die is a silicon die.

In some embodiments, a method for fabrication of an electronic device or system includes obtaining a die and package substrate for the electronic device or system; forming interconnects for an interconnection between the die and the package substrate, where the interconnects include includes a solder, the solder including tin (Sn), copper (Cu), and indium (In); and bonding the die to the package substrate using the interconnects.

In some embodiments, bonding the die to the package substrate includes formation of a thermal compression bond (TCB).

In some embodiments, bonding the die to the package substrate further includes reflowing the solder.

In some embodiments, the solder includes between 0.1% and 2.0% indium by weight. In some embodiments, the solder includes between 0.5% and 1.0% indium by weight. In some embodiments, the solder includes between 0.1% and 1.0% copper by weight.

In some embodiments, the interconnection between the die and the package substrate further includes a nickel (Ni) layer.

In some embodiments, bonding the die to the package substrate includes a process that is also applicable for SnCu solder and SnAg solder.

In some embodiments, a system includes a plurality of components including a processor for the processing of data, a memory for the storage of data, and a transmitter or receiver for the transmission or reception of data using an antenna; a die including one or more of the plurality of components; and a package substrate, the die being bonded to the package substrate by an interconnection including a plurality of interconnects, wherein the interconnects include a solder, the solder including tin (Sn), copper (Cu), and indium (In).

In some embodiments, the bonding of the interconnects includes a thermal compression bond (TCB).

In some embodiments, the bonding of the interconnects further includes reflow of the solder.

In some embodiments, the solder includes between 0.1% and 2.0% indium by weight. In some embodiments, the solder includes between 0.5% and 1.0% indium by weight. In some embodiments, the solder includes between 0.1% and 1.0% copper by weight.

In some embodiments, the interconnection further includes a nickel (Ni) layer.

What is claimed is:

1. An electronic device comprising:
   a die; and
   a package substrate, the die being bonded to the package substrate by an interconnection including a plurality of interconnects, each of the plurality of interconnects having a current direction;
   wherein the interconnects include a solder, the solder including tin (Sn), copper (Cu), and indium (In), wherein the solder is polycrystalline with tin (Sn) grains having a C-axis along a direction non-aligned with the current direction.

2. The electronic device of claim 1, wherein the bonding of the interconnects includes a thermal compression bond (TCB).

3. The electronic device of claim 2, wherein the bonding of the interconnects further includes reflow of the solder.

4. The electronic device of claim 1, wherein the solder includes between 0.1% and 2.0% indium by weight.

5. The electronic device of claim 4, wherein the solder includes between 0.5% and 1.0% indium by weight.

6. The electronic device of claim 1, wherein the solder includes between 0.1% and 1.0% copper by weight.

7. The electronic device of claim 1, wherein the interconnection further includes a nickel (Ni) layer.

8. The electronic device of claim 1, wherein the die is a silicon die.

9. A method for fabrication of an electronic device or system comprising:
   obtaining a die and a package substrate for the electronic device or system;
   forming interconnects for an interconnection between the die and the package substrate, each of the plurality of interconnects having a current direction, where the interconnects include includes a solder, the solder including tin (Sn), copper (Cu), and indium (In), wherein the solder is polycrystalline with tin (Sn) grains having a C-axis along a direction non-aligned with the current direction; and
   bonding the die to the package substrate using the interconnects.

10. The method of claim 9, wherein bonding the die to the package substrate includes formation of a thermal compression bond (TCB).

11. The method of claim 10, wherein bonding the die to the package substrate further includes reflowing the solder.

12. The method of claim 9, wherein the solder includes between 0.1% and 2.0% indium by weight.

13. The method of claim 12, wherein the solder includes between 0.5% and 1.0% indium by weight.

14. The method of claim 9, wherein the solder includes between 0.1% and 1.0% copper by weight.

15. The method of claim 9, wherein the interconnection between the die and the package substrate further includes a nickel (Ni) layer.

16. The method of claim 9, wherein bonding the die to the package substrate includes a process that is also applicable for SnCu solder and SnAg solder.

17. A system comprising: a plurality of components including:
   a processor for the processing of data, a memory for the storage of data, and a transmitter or receiver for the transmission or reception of data using an antenna;
   a die including one or more of the plurality of components; and
   a package substrate, the die being bonded to the package substrate by an interconnection including a plurality of interconnects, each of the plurality of interconnects having a current direction;
   wherein the interconnects include a solder, the solder including tin (Sn), copper (Cu), and indium (In), wherein the solder is polycrystalline with tin (Sn) grains having a C-axis along a direction non-aligned with the current direction.

18. The system of claim 17, wherein the bonding of the interconnects includes a thermal compression bond (TCB).

19. The system of claim 18, wherein the bonding of the interconnects further includes reflow of the solder.

20. The system of claim 18, wherein the solder includes between 0.1% and 1.0% copper by weight.

21. The system of claim 18, wherein the interconnection further includes a nickel (Ni) layer.

22. The system of claim 17, wherein the solder includes between 0.1% and 2.0% indium by weight.

23. The system of claim 22, wherein the solder includes between 0.5% and 1.0% indium by weight.

* * * * *